United States Patent [19]
Yamazaki

[11] Patent Number: 4,829,013
[45] Date of Patent: May 9, 1989

[54] SEMICONDUCTOR PHOTOELECTRIC CONVERSION DEVICE, LIGHT-TRANSPARENT SUBSTRATE THEREFOR AND THEIR MANUFACTURING METHODS

[75] Inventor: Shunpei Yamazaki, Tokyo, Japan

[73] Assignee: Semiconductor Energy Laboratory Co., Ltd., Kanagawa, Japan

[21] Appl. No.: 79,468

[22] Filed: Jul. 30, 1987

Related U.S. Application Data

[62] Division of Ser. No. 569,860, Jan. 11, 1984, Pat. No. 4,703,337.

[30] Foreign Application Priority Data

Jan. 12, 1983 [JP] Japan .................................. 58-3156

[51] Int. Cl.[4] ............................................. H01L 31/18
[52] U.S. Cl. ................................... 437/2; 437/3; 437/4; 437/5
[58] Field of Search ............ 156/643, 660, 657, 659.1; 437/2, 3, 4, 5

[56] References Cited

U.S. PATENT DOCUMENTS

| | | | |
|---|---|---|---|
| 4,135,290 | 1/1979 | Evans, Jr. ......................... | 437/5 X |
| 4,348,254 | 9/1982 | Lindmayer ......................... | 156/647 |
| 4,350,561 | 9/1982 | Little ............................... | 156/647 X |
| 4,767,336 | 8/1988 | Yamazaki ......................... | 437/2 |

Primary Examiner—David L. Lacey
Assistant Examiner—Thi Dang
Attorney, Agent, or Firm—Gerald J. Ferguson, Jr.

[57] ABSTRACT

In a semiconductor photoelectric conversion device in which a first light-transparent conductive layer for an electrode is formed on a light transparent substrate, a non-single-crystal semiconductor laminate member having formed therein at least one PIN or PN junction is formed on the first conductive layer and a second conductive layer for another electrode is formed on the semiconductor laminate member, the boundary between the substrate and the first conductive layer is formed by a first uneven surface including a number of surfaces of convexities, each having triangular, trapezoidal or like cross-section the base of which extend along the substrate surface and the two lateral edges of which are inclined thereto and make an angle $\phi$ to each other, where $45° \leq \phi < 120°$. The boundary between the first conductive layer and the semiconductor laminate member is formed by a second uneven surface corresponding to the first one. Further, the second conductive layer is reflective, and the boundary between the semiconductor laminate member and the second conductive layer is formed by a third uneven surface.

3 Claims, 5 Drawing Sheets

SEMICONDUCTOR PHOTOELECTRIC CONVERSION DEVICE, LIGHT-TRANSPARENT SUBSTRATE THEREFOR AND THEIR MANUFACTURING METHODS

This is a divisional application of Ser. No. 569,860, filed Jan. 11, 1984, now U.S. Pat. No. 4,703,337.

BACKGROUND OF THE INVENTION

1. Field of the Invention

The present invention relates to improvement in or relating to a semiconductor photoelectric conversion device which has a light-transparent substrate, a light-transparent first conductive layer formed on the substrate to serve as an electrode, a non-single-crystal semiconductor laminate member formed on the first conductive layer and having formed therein at least one PIN or PN junction, and a second conductive layer formed on the non-single-crystal semiconductor laminate member to serve as an electrode. Also, the invention pertains to a method for the manufacture of such a semiconductor photoelectric conversion device, improvement in a light-transparent substrate for use therein and a method for the manufacture of such a light-transparent substrate.

2. Description of the Prior Art

In conventional semiconductor photoelectric coversion devices of the abovesaid type, the light-transparent substrate usually has a flat surface with which the light-transparent first conductive layer serving as an electrode is in contact. Consequently, the boundaries between the light-transparent substrate and the light-transparent first conductive layer, between the light-transparent first conductive layer and the non-single-crystal semiconductor laminate member, and between the non-single-crystal semiconductor laminate member and the second conductive layer are flat boundaries extending along the substrate surface.

With the conventional semiconductor photoelectric conversion device of such a structure, light incident on the light-transparent substrate on the side opposite from the first conductive layer mostly enters thereinto through the substate, but a portion of the light is reflected at the boundary between the substrate and the first conductive layer and back to the outside through the substrate.

Further, the light having entered into the light-transparent first conductive layer mostly enters into the non-single-crystal semiconductor laminate member, but a portion of the light is similarly reflected at the boundary between the first conductive layer and the non-single-crystal semiconductor laminate member and back to the outside through the first conductive layer and the light-transparent substrate.

The light having entered into the non-single-crystal semiconductor laminate member travels therein in its thickwise direction, creating electron-hole pairs. When the light travels in the non-single-crystal semiconductor laminate member from the boundary between it and the light-transparent first conductive layer to the boundary between it and the second conductive layer, the light travels only a distance equal to the thickness of the non-single-crystal semiconductor laminate member.

Holes (or Electrons) of the electron-hole pairs generated in the non-single-crystal semiconductor laminate member flow across thereto to reach the light-transparent first conductive layer, and the electrons (or holes) flow across the non-single-crystal semiconductor laminate member to reach the second conductive layer, developing electromotive force across the first and second conductive layers. In this casse, a maximum value of the difference between the thickness of the non-single-crystal semiconductor laminate member and the thickness of the non-single-crystal semiconductor layer of the semiconductor laminate member formed in contact with the first conductive layer cannot be selected greater than a maximum distance of travel over which the electrons (or holes) of the electron-hole pairs, created at and in the vicinity of the boundary between the non-single-crystal semiconductor layer of the non-single-crystal semiconductor laminate member formed in contact with the first conductive layer and another non-single-crystal semiconductor layer formed thereon, can flow to reach the second conductive layer. Therefore, when light travels in the non-single-crystal semiconductor laminate member from the boundary between it and the first conductive layer to the boundary between it and the second conductive layer, the light does not travel in excess of the abovesaid maximum distance of travel in the region from the boundary between the non-single-crystal semiconductor layer of the non-single-crystal semiconductor laminate member formed in contact with the first conductive layer and the non-single-crystal semiconductor layer formed thereon to the boundary between the non-single-crystal semiconductor laminate member and the second conductive layer.

For the reason given above, the prior art semiconductor photoelectric conversion devices are extremely poor in the efficiency of utilization of incident light and large in the actual distance of travel of the carriers (electrons or holes) to the conductive layer serving as the electrode, and hence are very difficult to achieve a photoelectric conversion efficiency higher than 8%.

SUMMARY OF THE INVENTION

It is therefore an object of the present invention to provide a novel semiconductor photoelectric conversion device which achieves an extremely high photoelectric conversion efficiency as compared with the conventional semiconductor photoelectric conversion devices.

Another object of the present invention is to provide a novel method which permits easy manufacture of the semiconductor photoelectric conversion device of the present invention.

Another object of the present invention is to provide a novel light-transparent substrate with a transparent conductive layer for an electrode which is suitable for use in the semiconductor photoelectric conversion device of the present invention.

Yet another object of the present invention is to provide a novel method which permits easy fabrication of the light-transparent substrate of the present invention.

The semiconductor photoelectric conversion device of the present invention is comprised of a light-transparent substrate, a light-transparent first conductive layer formed on the substrate and serving as an electrode, a non-single-crystal semiconductor laminate member formed on the first conductive layer and having formed therein at least one PIN or PN junction and a second conductive layer formed on the non-single-crystal semiconductor laminate member and serving as an electrode, as is the case with the conventional semiconductor photoelectric conversion device described previously.

According to the semiconductor photoelectric conversion device of the present invention, however, the boundary between the substrate and the first conductive layer is formed by a first uneven surface including a number of surfaces of convexities, each having a triangular, trapezoidal or like section the base of which extends along the substrate surface and the two lateral edges of which are inclined thereto and make an angle $\phi$ to each other, where $45° \leq \phi < 120°$.

With such an arrangement, an appreciable portion of light incident on the substrate from the outside thereof on the side opposite from the first conductive layer enters thereinto, and a portion of the light is reflected at the boundary between the substrate and the first conductive layer. The reflected light is directed as a first reflected light to the first conductive layer through the substrate, and a portion of the first reflected light is reflected again at the boundary between the substrate and the first conductive layer, but an appreciable portion of the first reflected light enters into the first conductive layer. In some cases, the first reflected light, which has been reflected at the boundary between the substrate and the first conductive layer, is directed as a second reflected light to the first conductive layer through the substrate, and an appreciable portion of the second reflected light enters into the first conductive layer.

Accordingly, the semiconductor photoelectric conversion device of the present invention utilizes incident light with far higher efficiency than that of the prior art semiconductor photoelectric conversion device, and hence it achieves a far higher photoelectric conversion efficiency than does the conventional semiconductor photoelectric conversion device.

Moreover, in the semiconductor photoelectric conversion device of the present invention, the boundary between the substrate and the first conductive layer is formed by the aforementioned first uneven surface, and the boundary between the first conductive layer and the non-single-crystal semiconductor laminate member is formed by a second uneven boundary corresponding to the first one.

On account of this, an appreciable portion of the light incident on the substrate from the outside thereof and an appreciable portion of at least the aforesaid first reflected light enter into the first conductive layer. A considerable portion of the light having entered into the first conductive layer enters into the non-single-crystal semiconductor laminate member, and a portion of the light is reflected at the boundary between the first conductive layer and the non-single-crystal semiconductor laminate member. The reflected light travels towards the substrate in the first conductive layer, and a considerable portion of the reflected light is reflected at the boundary between the substrate and the first conductive layer. A considerable portion of the latter reflected light enters into the non-single-crystal semiconductor laminate member, and a portion of the latter reflected light is reflected at the boundary between the first conductive layer and the non-single-crystal semiconductor laminate member. Thereafter, similar incidence and reflection of the reflected light are repeated.

Therefore, the semiconductor photoelectric conversion device of the present invention utilizes incident light with far higher efficiency than that obtainable with the conventional semiconductor photoelectric conversion device, and hence achieves far higher photoelectric conversion efficiency than does the conventional semiconductor photoelectric conversion device.

Besides, in the semiconductor photoelectric conversion device of the present invention, the boundary between the substrate and the first conductive layer is formed by the aforementioned first uneven surface, and the second conductive layer is reflective and, further, the boundary between the non-single-crystal semiconductor laminate member and the second conductive layer is formed by a third uneven surface including a number of surfaces of convexities, each having a triangular, trapezoidal or like section the base of which extends along the substrate surface and the two lateral edges of which are inclined thereto.

With such an arrangement, a considerable portion of light incident on the substrate from the outside thereof and at least a considerable portion of the aforementioned first reflected light enter into the first conductive layer, and the light having entered into the first conductive layer mostly enter into the non-single-crystal semiconductor laminate member. An appreciable portion of the light having entered into the non-single-crystal semiconductor laminate member travels therein in a direction oblique to its thickwise direction, creating electron-hole pairs in the non-single-crystal semiconductor laminate member. In this case, the distance over which the light travels in the non-single-crystal semiconductor laminate member obliquely to its thickwise direction from the boundary between it and the first conductive layer to the boundary between it and the second conductive layer is greater than the thickness of the non-single-crystal semiconductor laminate member.

Further, holes (or elecrons) of the electon-holes pairs created in the non-single-crystal semiconductor laminate member flow across there to to reach the first conductive layer, and the electrons (or holes) flow across the semiconductor laminate member to reach the second conductive layer, thereby developing electromotive force across the first and second conductive layers. In this case, a minimum value of the distance between inner sides of the first and second conductive layers is smaller than the thickness of the non-single-crystal semiconductor laminate member. A maximum value of the difference between the thickness of the non-single-crystal semiconductor laminate member and the thickness of a non-single-crystal semiconductor layer of the non-single-crystal semiconductor laminate member found in contact with the first conductive layer on a line of the minimum distance between the inner sides of the first and second conductive layers cannot be selected greater than a maximum distance of travel over which the electrons (or holes) of the electron-hole pairs created at and in the vicinity of the boundary between the non-single-crystal semiconductor layer of the non-single-crystal semiconductor laminate member formed in contact with the first conductive layer and the non-single-crystal semiconductor layer formed thereon can reach the second conductive layer along the line of the minimum distance between the inner sides of the first and second conductive layers. But the minimum value of the difference between the thickness of the non-single-crystal semiconductor laminate member and its non-single-crystal semiconductor layer formed in contact with the first conductive layer is greater than the aforementioned maximum distance of travel. Consequently, when the light travels in the non-single-crystal semiconductor laminate member from the boundary between it and the first conductive layer to the boundary between it and the second conductive layer, the distance of travel of the light in the region from the boundary between the non-single-crystal semiconductor layer of the non-single-crystal semiconductor laminate member formed in contact with the first conductive layer and the non-single-crystal semiconductor layer formed thereon to the boundary between the non-single-crystal semiconductor laminate member and the second conductive layer is greater than the aforesaid maximum distance of travel.

The abovesaid arrangement ensures to markedly increase the efficiency of utilization of incident light and to decrease the actual distance of travel of the electrons (or holes) to the second conductive layer as compared with that obtainable with the prior art device, providing for improved photoelectric conversion efficiency.

The semiconductor photoelectric conversion device manufacturing method of the present invention includes a step of preparing a light-transparent substrate having a first uneven surface including a number of surfaces of convexities, each having a triangular, trapezoidal or like section the base of which extends along the substrate surface and the two lateral edges of which are inclined thereto and make an angle $\phi$ to each other, where $45° \leq \phi < 120°$, a step of forming on the substrate a light-transparent first conductive layer which will ultimately serve as an electrode, a step of forming on the first conductive layer a non-single-crystal semiconductor laminate member having formed therein at least one PIN or PN junction, and a step of forming on the non-single-crystal semiconductor laminate member a second conductive layer which will ultimately serve as an electrode.

Such a manufacturing method permits easy fabrication of the semiconductor photoelectric conversion device of the present invention which possesses the aforementioned advantages.

The light-transparent substrate of the present invention for use in the semiconductor photoelectric conversion device is comprised of a light-transparent substrate member and a light-transparent conductive layer which is formed thereon and will ultimately be used as an electrode. The boundary between the substrate and the conductive layer is formed by a uneven surface including a number of surfaces of convexities, each having a triangular, trapezoidal or like section the base of which extends along the surface of the substrate member and the two lateral edges of which are inclined thereto and make an angle $\phi$ to each other, where $45° \leq \phi < 120°$.

The use of such a light-transparent substrate allows ease in the fabrication of the semiconductor photoelectric conversion device of the present invention which has the aforementioned advantages.

The method for the manufacture of the light-transparent substrate of the present invention includes a step of preparing a light-transparent substrate member having an uneven surface including a number of surfaces of convexities, each having a triangular, trapezoidal or like section the base of which extends along the surface of the substrate member and the two lateral edges of which are inclined thereto and make an angle $\phi$ to each other, where $45° \leq \phi < 120°$, and a step of forming on the light-transparent substrate member a light-transparent conductive layer which will ultimately be used as an electrode.

With such a manufacturing method, the light-transparent substrate having the aforesaid advantages can easily be fabricated.

Other objects, features and advantages of the present invention will become more fully apparent from the following detailed description taken in conjunction with the accompanying drawings.

DESCRIPTION OF THE PREFERRED EMBODIMENTS

Figure 1:
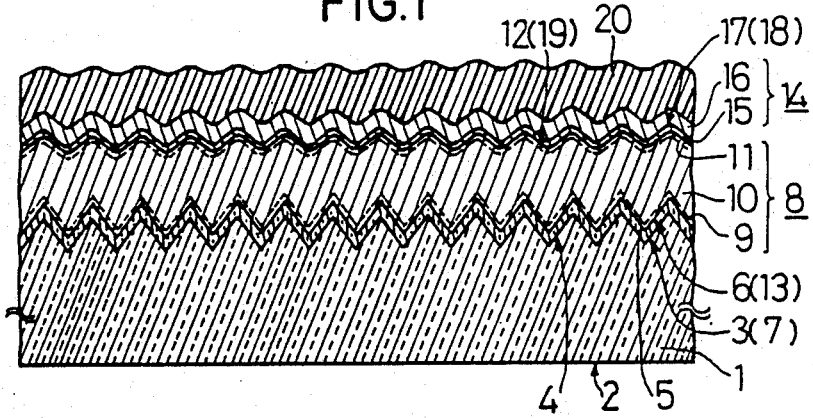
FIG. 1 is a cross-sectional view schematically showing the principal part of an embodiment of the semiconductor photoelectric conversion device of the present invention.

FIG. 1 illustrates an embodiment of the semiconductor photoelectric conversion device of the present invention, which has such a construction as will be described hereinbelow.

The semiconductor photoelectric conversion device is provided with a light-transparent insulating substate 1 formed of glass, light-transparent organic synthetic resin or the like.

Figure 2:
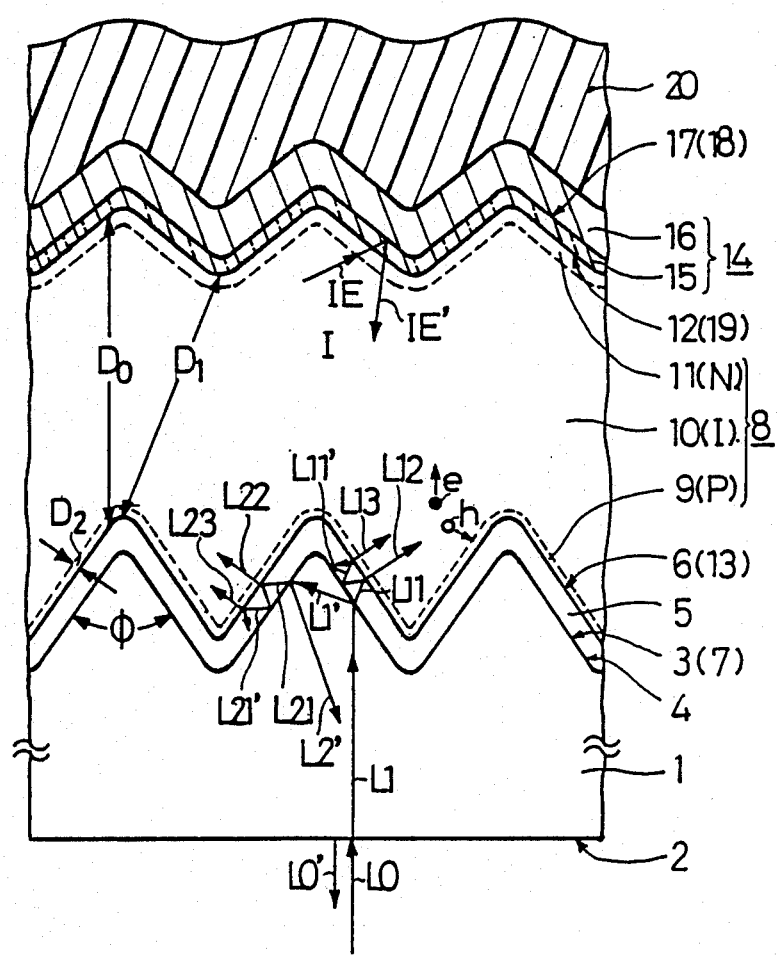
FIG. 2 is an enlarged cross-sectional view for assistance in explaining the embodiment shown in FIG. 1.

As will be seen from FIGS. 1 and 2, the light-transparent substrate 1 has a flat top surface 2 and an uneven bottom surface 3.

The uneven surface 3 includes a number of surfaces of convexities, the surfaces of which are indicated generally by 4.

The convexities each have a triangular, trapezoidal or like section, the base of which extends along the surface of the light-transparent substrate 1 or its flat surface 2 and the two lateral edges of which are inclined thereto and make an angle $\phi$ to each other which is $$45° \leq \phi < 120° \tag{1}$$

preferably, $$60° < \phi < 120° \tag{2}$$

more preferably, $$\phi = 70.5° \pm 20° \tag{3}$$

The convexities of such cross-sections are each a cone such as, for example, a circular cone or quadrangular pyramid, a frustrum of, for instance, circular cone or pyramid, or an oblong convex body. The convexities are each, in cross-section, 0.1 to 10μ long in the base thereof and 0.05 to 2μ high.

Since the convexities each have the abovesaid cross-section, its surface 4 has a triangular, trapezoidal or like cross-section. The surfaces 4 of the convexities are each shown to have a triangular cross-section with a round vertex.

The surfaces 4 of the convexities included in the uneven surface 3 may be arranged at random or regularly. The surfaces 4 of adjacent convexities may be contiguous to each other directly or through, for instance, a surface extending along the surface of the light-transparent substrate 1.

It is desirable, however, that the surfaces 4 of the convexities be contiguous to adjacent ones of them regularly and directly. In this case, when the convexities are each a cone or frustrum of cone, their surfaces are arranged, in a matrix form, at intersecting points of a number of parallel lines arranged in a first direction, for example, in the lengthwise direction of the light-transparent substrate 1 at a pitch equal to the 0.1 to 10μ length of the base of each convexity and a number of parallel lines arranged in a second direction perpendicular to the first direction and at the same pitch as the abovesaid one. When the convexities are railed-shaped ones, their surfaces 4 are arranged in the first or second direction at the pitch equal to the length of their base. In FIGS. 1 and 2, the surfaces 4 of adjacent convexities are shown to be joined together through round vertexes defined therebetween.

On the uneven surface 3 of the light-transparent substrate 1 is formed a light-transparent conductive layer 5 which serves as an electrode. The conductive layer 5 is formed of a metallic oxide, which is a tin oxide, or a light-transparent conductive material consisting principally thereof. The conductive layer 5 is formed to a relatively small thickness, for instance, 1500 to 2000 angstromes and has a surface formed by an uneven surface 6 exactly corresponding to the uneven surface 3 of the light-transparent substrate 1. With the provision of such a conductive layer 5 on the uneven surface 3 of the light-transparent substrate 1, the boundary between the light-transparent substrate 1 and the conductive layer 5 is formed by an uneven surface 7 which is the same as the uneven surface 3 of the light-transparent substrate 1.

On the uneven surface 6 of the conductive layer 5 is formed a non-single-crystal semiconductor laminate member 8. The non-single-crystal semiconductor laminate member 8 is comprised of a P-type non-single-crystal semiconductor layer 9, an I-type non-single-crystal semiconductor laminate layer 10 and an N-type non-single-crystal semiconductor layer 11 which are laminated in this order. The non-single-crystal semiconductor layers 9, 10 and 11 form one PIN junction.

The non-single-crystal semiconductor layer 9 has a thickness of, for example, 70 to 150 angstromes, preferably, 100 angstromes, and has a surface formed by an uneven surface exactly corresponding to the uneven surface 6 of the conductive layer 5.

The non-single-crystal semiconductor layer 10 has a relatively large thickness of, for instance, 0.4 to 0.7μ, and has a surface formed by such an uneven surface that one irregularity corresponds to one or more, for example, three to five irregularities of the uneven surface of the non-single-crystal semiconductor layer 9. In the drawings, the surface of the non-single-crystal semiconductor layer 10 is shown to be formed by such an uneven surface that its irregularities have one-to-one correspondence to the irregularities of the uneven surface of the non-single-crystal semiconductor layer 9.

The non-single-crystal semiconductor layer 11 has a relatively small thickness of, for example, 100 to 200 angstromes, and has a surface formed by an uneven surface whose irregularities have one-to-one correspondence to the irregularities of the uneven surface of the non-single-crystal semiconductor layer 10.

The surface of the non-single-crystal semiconductor laminate member 8 made up of the layers 9, 10 and 11 is the surface of the layer 11, and hence it is formed by such an uneven surface 12 that one irregularity corresponds to one or more irregularities of the uneven surface 7 which forms the boundary between the light-transparent substrate 1 and the conductive layer 5. In the drawings, however, the uneven surface 12 of the non-single-crystal semiconductor laminate member 8 is shown to be such an uneven surface that its irregularities have one-to-one correspondence to the irregularities of the uneven surface 7 of the boundary between the light-transparent substrate 1 and the conductive layer 5.

With the formation of the non-single-crystal semiconductor laminate member 8 on the uneven surface 6 of the conductive layer 5, there is formed between the light-transparent substrate 1 and the non-single-crystal semiconductor laminate member 8 the boundary formed by an uneven surface 13 corresponding to the uneven surface 7 of the boundary between the light-transparent substrate 1 and the conductive layer 5.

The non-single-crystal semiconductor layer 9 of the non-single-crystal semiconductor laminate member 8 is formed of amorphous, semi-amorphous or microcrystalline Si, $Si_xC_{1-x}$ ($0<x<1$, where $x=0.8$, for example), or Ge, and it has introduced thereinto a P-type impurity (boron) with such a high concentration as $1\times10^{19}$ to $6\times10^{20}$ atoms/cm$^3$.

The non-single-crystal semiconductor layer 10 is formed of, for instance, amorphous or semi-amorphous silicon, and it has introduced thereinto a P-type impurity (boron) with such a concentration distribution that the impurity concentration linearly and continuously lowers towards the non-single-crystal semiconductor layer 11 in the thickwise direction of the layer 10. In this case, the ratio of the impurity concentration in the layer 10 at the end portion thereof on the side of the layer 11 to the impurity concentration at the end portion on the side of the layer 9 is 1/10 to 1/100, preferably, 1/20 to 1/40. In practice, the impurity concentration in the layer 10 is $2\times10^{15}$ to $2\times10^{17}$ atoms/cm$^3$ at the end portion on the side of the layer 9 and $1\times10^{15}$ atoms/cm$^3$ at the end portion on the side of the layer 11.

The non-single-crystal semiconductor layer 11 is formed of, for instance, microcrystalline Si or $Si_xC_{1-x}$ and has introduced thereinto an N-type impurity (phosphorus) with a concentration of $1\times10^{19}$ to $6\times10^{20}$ atoms/cm$^3$.

On the surface of the non-single-crystal semiconductor laminate member 8, formed by the uneven surface 12, there is formed a reflective conductive layer 14 which will ultimately serve as an electrode. The conductive layer 14 may be a single layer formed of, for instance, aluminum (Al) or silver (Ag), or a reflective metal material consisting principally of either one of them. It is preferable, however, that the conductive layer 14 be a laminate member which is comprised of a light-transparent conductive layer 15 formed of, for example, a tin oxide, or a light-transparent conductive material consisting principally thereof, and a reflective conductive layer 16 formed of, for instance, aluminum or silver, or a metal consisting principally of either one of them, as shown. In this case, the light-transparent conductive layer 15 has a relatively small thickness of 900 to 1300 angstromes, and has a surface formed by an uneven surface 17 corresponding to the uneven surface 12 of the non-single-crystal semiconductor laminate member 8. The reflective conductive layer 16 is thicker than the light-transparent conductive layer 15. The surface of the reflective conductive layer 16 need not always be uneven but, in practice, it is an uneven surface corresponding to the uneven surface 17 of the light-transparent conductive layer 15.

With the formation of the reflective conductive layer 16 on the light-transparent conductive layer 15, there is formed between the layers 15 and 16 the boundary formed by the same uneven surface 18 as that 17 of the layer 15.

With the formation of the conductive layer 14 on the uneven surface 12 of the non-single-crystal semiconductor laminate member 8, there is formed between it and the conductive layer 14 the boundary formed by the same uneven surface 19 as that 12 of the laminate member 8.

The surface of the conductive layer 14 is covered with an insulating protective layer 20 formed as of an organic synthetic resinous material.

The semiconductor photoelectric conversion device of the present invention shown in FIGS. 1 and 2 produces the following operational effects:

When light LO is applied to the light-transparent substrate 1 on the side opposite from the conductive layer 5 perpendicularly to the flat substrate surface 2, a portion of the light LO is reflected by the flat substrate surface 2 back to the outside as indicated by LO′. But the light LO mostly enters into the substrate 1 as indicated by L1.

A considerable portion of the light L1 enters into the light-transparent conductive layer 5 as indicated by L11, and a portion of the light L11 is reflected at the uneven boundary 7 between the substrate 1 and the conductive layer 5 as indicated by L1′. The reflected light L1′ mostly travels through the substrate 1 towards the conductive layer 5, and an appreciable portion of the reflected light L1′ enters into the conductive layer 5 as indicated by L21 and a portion of the reflected light L1′ is reflected at the uneven boundary 7 between the substrate 1 and the conductive layer 5 as indicated by L2′. The greater part of the reflected light L2′ passes through the substrate 1 to the outside when the angle $\phi$ between the two lateral edges of each convexity is in the range of $60° < \phi < 120°$ as illustrated. In a case of $60° \geq \phi \geq 45°$, the reflected light L2′ passes through the substrate 1 towards the conductive layer 5, and an appreciable portion of the reflected light L2′ enters into the layer 5 as indicated by L31, and a portion of the reflected light L2′ is reflected at the uneven surface 7 and is mostly directed to the outside.

In this way, upon incidence of the light L1 in the substrate 1, the lights L11 and L12 or L11 to L31 enter into the conductive layer 5. Accordingly, the loss of the light entering into the conductive layer 5 is slight relative to the incident light L1.

An appreciable portion of the light L11 having entered into the light-transparent conductive layer 5 enters into the non-single-crystal semiconductor laminate member 8 as indicated by L12, and a portion of the light L11 is reflected at the uneven boundary 13 between the conductive layer 5 and the non-single-crystal semiconductor laminate member 8 as indicated by L11′. The reflected light L11′ passes through the conductive layer 5 towards the substrate 1, and a considerable portion of the reflected light L11′ is reflected at the uneven boundary 7 between the substrate 1 and the conductive layer 5 as indicated by L12′ and mostly enters into the non-single-crystal semiconductor laminate member 8 as indicated by L13, and a portion of the reflected light L12′ is reflected at the uneven boundary 13 between the conductive layer 5 and the non-single-crystal semiconductor laminate member 8. Thereafter, similar incidence and reflection are repeated. Consequently, the lights L12, L13 . . . enter into the non-single-crystal semiconductor laminate member 8 on the basis of the light L11 applied to the conductive layer 5.

Based on the light L21 having entered into the conductive layer 5, the lights L22, L23, . . . corresponding to the lights L12, L13, . . . , respectively, enter into the non-single-crystal semiconductor laminate member 8 as is the case with the light L11, though not described in detail. As for the light L31 having entered into the conductive layer 5, too, the lights L32, L33, . . . corresponding to those L22, L23, . . . , respectively, enter into the non-single-crystal semiconductor laminate member 8.

Accordingly, the lights L12, L13, . . . and L22, L23, . . . based on the lights L11 and 21 having entered into the conductive layer 5, or the lights L12, L13, . . . L22, L23, . . . and L32, L33, . . . based on the light L11, L21 and L31, respectively, enter into the non-single-crystal semiconductor laminate member 8. The loss of the light entering into the non-single-crystal semiconductor laminate member 8 (which light will hereinafter be referred to as the light LE) is slight relative to the light having entered into the conductive layer 5.

For the reason given above, the loss of the light LE, which enters into the non-single-crystal semiconductor laminate member 8 is slightly greater than the loss by the reflected light LO′ relative to the incident light LO.

Since the light LE directed to the non-single-crystal semiconductor laminate member 8 is refracted while it passes through the substrate 1, the uneven boundary 7 between it and the conductive layer 5, the conductive layer 5 and the uneven boundary 13 between it and the non-single-crystal semiconductor laminate member 8, the light LE, after having entered into the non-single-crystal semiconductor laminate member 8, mostly travels therein in a direction oblique to its thickwise direction, as illustrated. While the light LE travels in the non-single-crystal semiconductor laminate member 8, electron-hole pairs are created mainly in the I-type non-single-crystal semiconductor layer 10 of the semiconductor laminate member 8.

In a case where the light LE travels in the non-single-crystal semiconductor laminate member 8, obliquely to its thickwise direction, from the uneven boundary 13 between the conductive layer 5 and the laminate member 8 to the uneven boundary 19 between it and the conductive layer 14, the light LE travels, for the greater part, a distance greater than the thickness $D_0$ of the semiconductor laminate member 8. Accordingly, the path length of the light LE from the boundary 13 between the conductive layer 5 and the non-single-crystal semiconductor laminate member 8 to the boundary 19 between the laminate member 8 and the conductive layer 14 is greater than the thickness $D_0$ of the laminate member 8.

Further, when entering into the conductive layer 14 passing through the non-single-crystal semiconductor laminate member 8, the light LE is reflected at the boundary 18 between the light-transparent conductive layer 15 and the reflective conductive layer 16 forming the conductive layer 14, and the reflected light LE' is directed into the semiconductor laminate member 8.

For the reason given above, the electron-hole pairs can be created in the non-single-crystal semiconductor layer 10 of the non-single-crystal semiconductor laminate member 8 through efficient utilization of the light LE.

The holes h of the electron-hole pairs generated in the non-single-crystal semiconductor layer 10 of the laminate member 8 flow across the laminate member 8 to reach the conductive layer 5, whereas the electrons e are similarly flow across the laminate member 8 to reach the conductive layer 14.

The distance between the inner sides of the conductive layers 5 and 14 takes a minimum value $D_1$ between the vertex of each convexity of the uneven surface 6 of the conductive layer 5 and that portion of the conductive layer 14 which is in contact with the bottom of the recess of the uneven surface 12 of the non-single-crystal semiconductor laminate member 8 which is nearest to the abovesaid vertex of the convexity, as shown. The minimum value $D_1$ is smaller than the thickness $D_0$ of the laminate member 8. In the non-single-crystal semiconductor laminate member 8, the electric field intensity on the line of the minimum value $D_1$ is higher than the field intensity on any other lines, so that the electrons e developed in the non-single-crystal semiconductor layer 10 of the laminate member 8 mostly flow along the line of the minimum value $D_1$ towards the conductive layer 14. A maximum value of the difference, $(D_1-D_2)$, between the thickness $D_1$ of the non-single-crystal semiconductor laminate member 8 on the line of the minimum value $D_1$ and the thickness $D_2$ of the non-single-crystal semiconductor layer 10 of the laminate member 8 cannot be selected greater than a maximum distance of travel over which the electrons e of the electron-hole pairs, created at or in the vicinity of the boundary between the non-single-crystal semiconductor layers 9 and 10 of the laminate member 8 on the line of the minimum value $D_1$, can flow to reach the conductive layer 14.

But a minimum value of the difference, $(D_0-D_2)$, between the thickness $D_0$ of the laminate member 8 and the thickness $D_2$ of its non-single-semiconductor layer 9 is greater than the abovesaid maximum distance of travel $(D_1-D_2)$.

In consequence, when the light LE travels in the non-single-crystal semiconductor laminate member 8 from the boundary 13 between it and the conductive layer 5 to the boundary 19 between it and the conductive layer 14, the distance of travel of the light LE from the boundary between the non-single-crystal semiconductor layers 9 and 10 of the laminate member 8 to the boundary between it and the conductive layer 14 is greater than the abovesaid maximum distance of travel, $(D_1-D_2)$.

For the reason given above, the light LE incident on the non-single-crystal semiconductor laminate member 8 is utilized with high efficiency and the actual distance of travel of the electrons e to the conductive layer 14 can be reduced, ensuring to achieve high photoelectric conversion efficiency.

Incidentally, according to my experiments, the light LE, which was derived from the incident light LO from the outside and entered into the non-single-crystal semiconductor laminate member 8, was 78% of the light LO in a conventional photoelectric conversion device which was identical in construction with the device of the present invention shown in FIGS. 1 and 2 except that such boundaries as those between the substrate 1 and the conductive layer 5, between the conductive layer 5 and the non-single-crystal semiconductor laminate member 8 and between the laminate member 8 and the conductive layer 11 were flat surfaces extending along the substratae surface 2. On the other hand, the light LE was 93% of the light LO in the semiconductor photoelectric conversion device of the present invention shown in FIGS. 1 and 2. Further, in the conventional device of the abovesaid construction, an open-circuit voltage was 0.82 V, a shorting current density 14.9 mA/cm$^2$, a file factor 60.3% and a photoelectric conversion efficiency 7.37%, whereas, in the semiconductor photoelectric conversion device of the present invention, the open-circuit voltage was 0.92 V, the shorting current density 20.9 mA/cm$^2$, the file factor 67% and the photoelectric conversion efficiency 12.74%. The experiments were conducted under the conditions that the substrate 1 was 3 cm long and 3.5 mm wide, and hence had an area of 1.05 cm$^2$, and that the intensity of the light LO was AM1 (100 mW/cm$^2$).

Referring now to FIGS. 3 and 4, the semiconductor photoelectric conversion device manufacturing method of the present invention will be described as being applied to the fabrication of the semiconductor photoelectric conversion device of the present invention described previously in connection with FIGS. 1 and 2.

In FIGS. 3 and 4, the parts corresponding to those in FIGS. 1 and 2 are identified by the same reference numerals and no detailed description will be repeated.

Figure 3A:
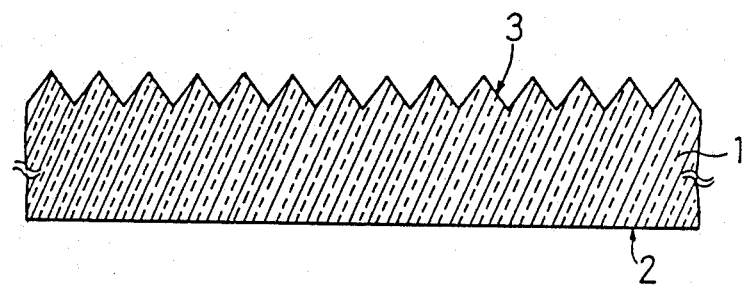
FIGS. 3A through 3E are schematic cross-sectional views illustrating a sequence of steps involved in the manufacture of the semiconductor photoelectric conversion device in accordance with an embodiment of the manufacturing method of the present invention.
Figure 3B:
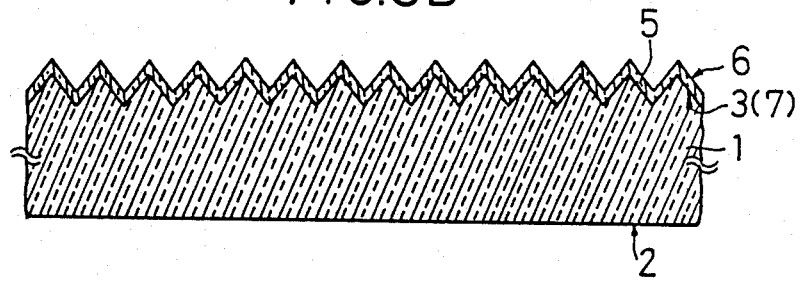

The manufacturing method of the present invention shown in FIGS. 3 and 4 comprises the following consecutive steps:

The manufacture starts with the preparation of the light-transparent substrate 1 which has the uneven surface 3 as described previously with respect to FIGS. 1 and 2 (FIG. 3A).

Figure 4A:
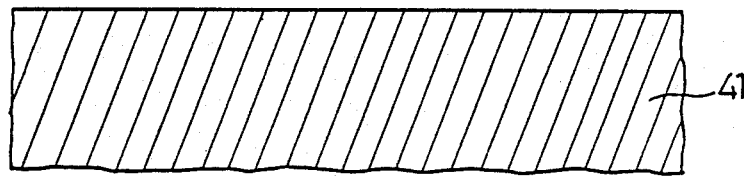
FIGS. 4A through 4D are schematic cross-sectional views illustrating, by way of example, a sequence of steps involved in the fabrication of a light-transparent substrate of FIG. 3A through using a mold.
Figure 4B:
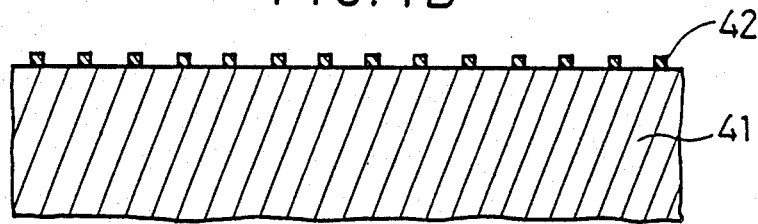
Figure 4C:
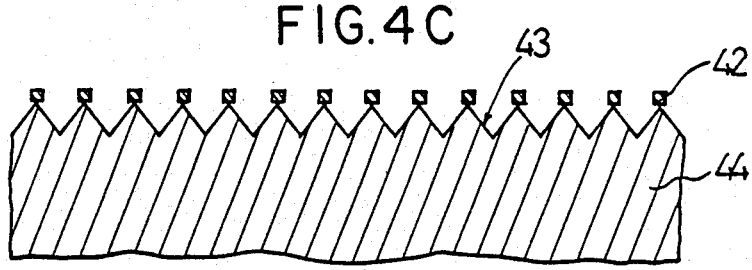
Figure 4D:
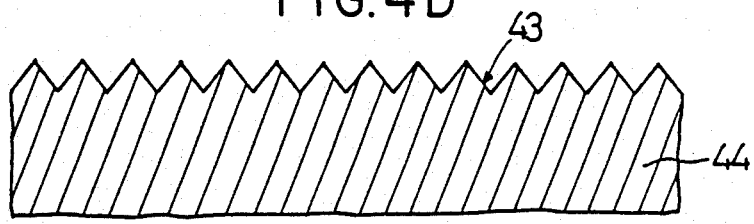

The light-transparent substrate 1 can be prepared through the use of such a mold 44 as shown in FIG. 4D which has an uneven surface 43 similar to that 3 of the substrate 1.

The mold 44 can be prepared in such a manner as described hereunder with regard to FIG. 4.

At first, a single-crystal silicon substrate 41 is prepared which has a flat surface formed by, for example, a (100) crystal plane (FIG. 4A).

A number of mask layers 42 as of a silicon oxide are formed in a predetermined pattern on the single-crystal silicon substrate 41 by a known method (FIG. 4B).

Next, the single-crystal substrate 41 is subjected to known anisotropic etching through the mask layers 42, using an etchant which is, for example, a mixture of ethylene diamine, pyrocatechol and water, by which the uneven surface 43 is formed on the single-crystal silicon substrate 41, obtaining the mold 44 (FIG. 4C). In this case, the uneven surface 43 is formed as an assembly of a number of surfaces (a (111) crystal plane of the single-crystal silicon) of convexities which are triangular in cross-section and in which the angle θ between their two lateral edges is 70.5°.

Finally, the mask layers 42 are removed from the mold 44.

In this way, the mold 44 is prepared.

One method for preparing the substrate 1 of FIG. 3A through using such a mold 44 is to pour a substrate material into the mold 44 with a mold releasing agent applied to its uneven surface 43, to solidify the material and then to disassemble from the mold 44 the solid body, which is used as the substrate 1.

In the above, the mold 44 is described to be formed of single-crystal silicon, but it may also be formed of metal or like material. In such a case, the substrate 1 can be obtained by pressing the mold 44 against a sheet-like substrate material member.

The light-transparent conductive layer 5, which will ultimately serve as an electrode, is formed by a known sputtering method, or the CVD techniques such as low pressure or plasma CVD methods, on the light-transparent substrate 1 prepared as described above (FIG. 3B).

Figure 3C:
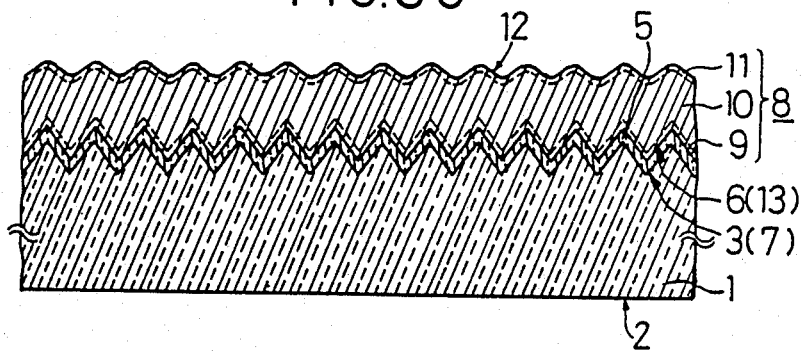
Figure 3D:
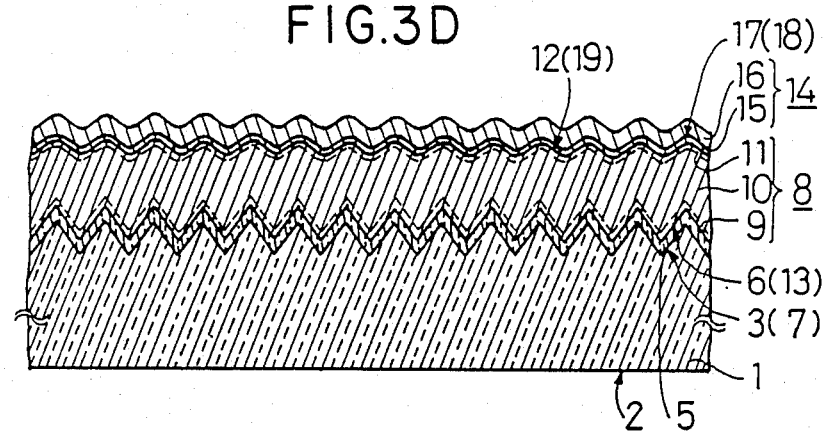
Figure 3E:
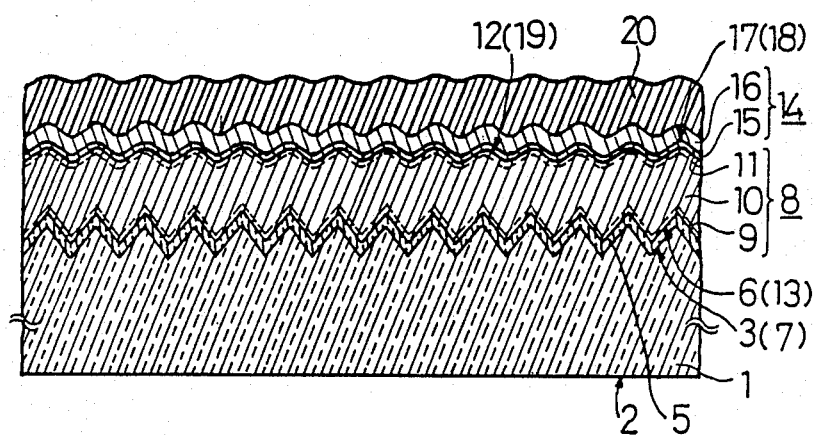

Next, the non-single-crystal semiconductor laminate member 8, comprised of the P-type non-single-crystal semiconductor layer 9, the I-type non-single-crystal semiconductor layer 10 and an N-type non-single-crystal semiconductor layer 11 laminated in this order, is formed on the light-transparent conductive layer 5 (FIG. 3C).

In this case, the non-single-crystal semiconductor layer 9 can be formed by the CVD techniques, such as a CVD method employing or not employing glow discharge (plasma), or a CVD method employing light, through using a semiconductor material gas composed of a hydride or halide of a semiconductor, such as Si, $Si_xC_{1-x}$, Ge or the like, and an impurity material gas composed of a hydride or halide of a P-type impurity, for example, diborane ($B_2H_6$).

The non-single-crystal semiconductor layer 10 can be formed by the CVD techniques, such as a CVD method employing or not employing glow discharge (plasma), or a CVD method employing light, through using a semiconductor material gas composed of a hydride or halide of silicon, such as $Si_nH_{2n+2}(n>1)$ or $SiF_m(m>2)$, and an impurity material gas composed of a hydride or halide of a P-type impurity, such as diborane ($B_2H_6$). In this case, by decreasing, with time, the concentration of the impurity material gas relative to the semiconductor material gas within a concentration range below 5 ppm, the P-type impurity (boron) can be introduced into the non-single-crystal semiconductor layer 10 with such a concentration distribution that the impurity concentration lowers linearly and continuously towards the non-single-crystal semiconductor layer 11 in the thickwise direction of the layer 10.

The non-single-crystal semiconductor layer 11 can be formed by the known CVD techniques, such as a CVD method employing or not employing glow discharge (plasma), or a CVD method employing light, through using a semiconductor material gas composed of a hydride or halide of silicon, such as $Si_nH_{2n+2}(n>1)$ or $SiF_m(m>2)$, and an impurity material gas composed of a hydride or halide of an N-type impurity, such as phosphine ($PH_3$).

Next, the conductive layer 14, which is comprised of the light-transparent conductive layer 15 and the reflective conductive layer 16 laminated in this order, is formed by, for example, a known vacuum evaporation method, on the non-single-crystal semiconductor laminate member 8 formed as described above (FIG. 3D).

Next, the protective layer 20 is formed on the conductive layer 14 through known various methods.

With such a manufacturing method of the present invention, though not described in detail, the semiconductor photoelectric conversion device of the present invention described previously in connection with FIGS. 1 and 2 can be manufactured with ease.

Moreover, in the step of forming the non-single-crystal semiconductor laminate member 8 on the conductive layer 5 on the light-transparent substrate 1, the laminate member 8 can be formed homogeneously because the concavities of the uneven surface 6 of the layer 5 are open at substantially the same angle as the aforementioned one φ.

Figure 5:
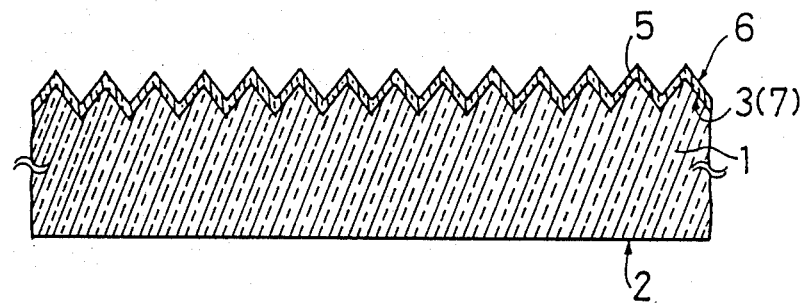
FIG. 5 is a schematic cross-sectional view illustrating an embodiment of a light-transparent substrate having a conductive layer for an electrode in accordance with the present invention.

Turning next to FIG. 5, an embodiment of the light-transparent substrate of the present invention will be described as being applied to the semiconductor photoelectric conversion device of the present invention described previously in connection with FIGS. 1 and 2.

In FIG. 5, the parts corresponding to those in FIGS. 1 and 2 are identified by the same reference numerals and no detailed description will be repeated.

The light-transparent substrate of the present invention, shown in FIG. 5, has the light-transparent substrate member 1 having the same uneven surface 3 as that described previously in connection with FIGS. 1 and 2, and the light-transparent conductive layer 5 formed on the uneven surface 3 as described previously with respect to FIGS. 1 and 2.

The light-transparent substrate of such a construction, though not described in detail, is suitable for use in the semiconductor photoelectric conversion device of the present invention described with respect to FIGS. 1 and 2.

Figure 6A:
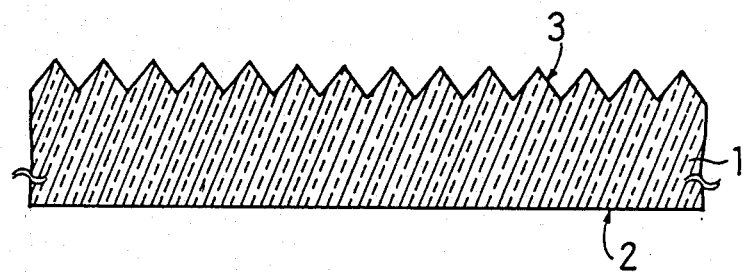
FIGS. 6A and 6B are schematic cross-sectional views illustrating a sequence of steps involved in the fabrication of the light-transparent substrate in accordance with the present invention.
Figure 6B:
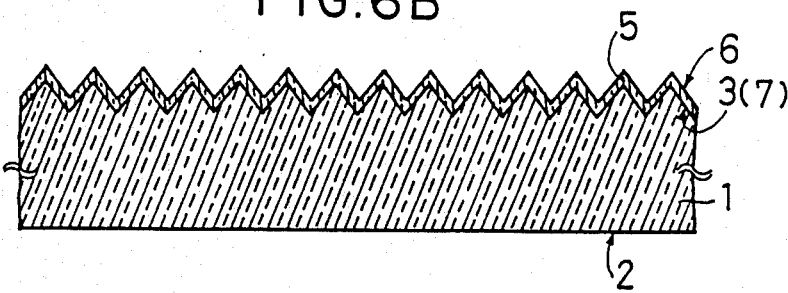

Turning now to FIG. 6, an embodiment of the light-transparent substrate manufacturing method of the present invention will be described as being applied to the light-transparent substrate shown in FIG. 5.

In FIG. 6, the parts corresponding to those in FIGS. 1 to 3 and 5 are identified by the same reference numerals and no detailed description will be repeated.

The light-transparent substrate manufacturing method of the present invention, shown in FIG. 6, includes the step of forming the light-transparent conductive layer 5 on the light-transparent substrate 1 in the semiconductor photoelectric conversion device described previously with regard to FIG. 3.

Accordingly, the light-transparent substrate 1 having the uneven surface 3 is prepared in the same manner as described previously in connection with FIG. 3, (FIG. 6A) and the light-transparent conductive layer 5 is formed on the light-transparent substrate 1 in the same manner as described previously with respect to FIG. 3, thereby obtaining the desired light-transparent substrate mentioned previously in connection with FIG. 5.

With such a manufacturing method of the present invention, the light-transparent substrate shown in FIG. 5 can be fabricated with ease.

While in the foregoing the semiconductor photoelectric conversion device has been described in connection with the case where the non-single-crystal semiconductor laminate member has formed therein one PIN junction, the laminate member can also be arranged to form two or more PIN junctions, or one or more PN junctions.

Besides, the foregoing description has been given of only one embodiment of each of the semiconductor photoelectric conversion device, the light-transparent substrate therefor and their manufacturing methods of the present invention, and it will be apparent that many modifications and variations may be effected without departing from the scope of the novel concepts of the present invention.

What is claimed is:

1. A method of manufacturing photoelectric conversion devices comprising the steps of:

forming first convexities on a surface of a silicon crystalline substrate;

pressing said surface having said first convexities against a sheet-like substrate to produce second convexities on said sheet-like substrate corresponding to the inversion of said first convexities;

subsequently forming a first electrode on said sheet-like substrate, said first electrode having imparted thereto third convexities corresponding to said first convexities;

subsequently depositing a photosensitive semiconductor film on said first electrode, said photosensitive semiconductor film having fourth convexities imparted thereto corresponding to said first convexities; and forming a second electrode on said photosensitive semiconductor film.

2. The method as claimed in claim 1 wherein all of said convexities have inclined surfaces having an angle of 45° to 120° therebetween.

3. The method as claimed in claim 2 wherein said photosensitive semiconductor film is a PIN junction.

* * * * *